United States Patent [19]

Tateyama et al.

[11] Patent Number: 5,375,291

[45] Date of Patent: Dec. 27, 1994

[54] DEVICE HAVING BRUSH FOR SCRUBBING SUBSTRATE

[75] Inventors: Kiyohisa Tateyama, Kumamoto; Michiaki Matsushita, Yatsushiro, both of Japan

[73] Assignees: Tokyo Electron Limited, Tokyo; Tokyo Electron Kyushu Limited, Tosu, both of Japan

[21] Appl. No.: 62,536

[22] Filed: May 18, 1993

[30] Foreign Application Priority Data

| May 18, 1992 | [JP] | Japan | 4-148938 |
| Jul. 17, 1992 | [JP] | Japan | 4-213733 |
| Jan. 29, 1993 | [JP] | Japan | 5-32515 |

[51] Int. Cl.⁵ .............................. B08B 3/02
[52] U.S. Cl. .......................... 15/302; 15/88.3; 15/309.2; 15/319; 134/153; 134/902
[58] Field of Search .......... 15/302, 309.2, 88.2, 15/88.3; 134/149, 153, 902

[56] References Cited

U.S. PATENT DOCUMENTS

| 4,544,446 | 10/1985 | Cady | 134/149 X |
| 4,750,505 | 6/1988 | Inuta et al. | 15/302 X |
| 4,788,994 | 12/1988 | Shinbara | 134/153 X |
| 4,871,417 | 10/1989 | Nishizawa et al. | 134/149 X |
| 5,169,408 | 12/1992 | Biggerstaff et al. | 134/149 X |
| 5,209,180 | 5/1993 | Shoda et al. | 134/153 X |

FOREIGN PATENT DOCUMENTS

| 57-45233 | 3/1982 | Japan . |
| 62-152136 | 7/1987 | Japan . |
| 3-9607 | 2/1991 | Japan . |

Primary Examiner—Chris K. Moore
Attorney, Agent, or Firm—Oblon, Spivak, McClelland, Maier, & Neustadt

[57] ABSTRACT

A substrate cleaning device comprising a motor for rotating a wafer together with a spin plate, claws for holding the wafer so as to form a space between the spin plate and the wafer, a jet nozzle through which cleaning solution is jetted onto an upper surface of the wafer, a rotating brush for brush-cleaning the upper surface of the wafer, a mechanism for blowing nitrogen gas or pure water onto the lower surface of the wafer, and a mechanism for exhausting the space between the spin plate and the wafer, wherein a solution passage for the solution blowing mechanism and an exhaust passage for the exhaust mechanism are formed in a drive shaft of the motor and communicated with the space.

15 Claims, 12 Drawing Sheets

DEVICE HAVING BRUSH FOR SCRUBBING SUBSTRATE

BACKGROUND OF THE INVENTION

1. Field of the Invention

The present invention relates to a device for scrubbing substrates such as semiconductor wafers, LCD substrates, photo-masks, ceramic substrates, compact disks and printed substrates by a brush while applying solution to substrates.

2. Description of the Related Art

In the case of the substrate scrubbing devices, contaminating particles can be removed from the wafer surface in such a way that the brush having nylon or mohair fibers planted is pushed against the semiconductor wafer while rotating the wafer together with spin chuck and applying cleaning solution to the wafer.

Japanese Patent Disclosure Sho 57-45233 discloses a device wherein vortexes are caused in a vortex chamber of the spin chuck and negative pressure caused by these vortexes is used to hold the semiconductor wafer. The vortex chamber has openings in the surface of the chuck and an inlet formed in a side wall thereof communicated with a passage in a rotating shaft of the spin chuck. In short, pressurized gas or solution is jetted into the vortex chamber through the inlet to cause vortexes in the vortex chamber.

In the case of this type of conventional device, however, dust such as particles caused in bearings are blown together with solution to the semiconductor wafer. They are thus caused to adhere to the bottom surface of the wafer, thereby causing the productivity to be lowered. In addition, they are also caused to enter into a motor to break it down.

Japanese Patent Publication Hei 3-9607 discloses a spin chuck of the grip type wherein the wafer is gripped at its outer rim by three or more claws. In the case of this type of spin chuck, however, the device becomes complicated in structure and large in size because it must have drive sources for two system lines.

Furthermore, a spin chuck wherein weights are connected to chuck sections which can move toward the rotating center of the wafer and the chuck sections are moved by centrifugal force added to the weights when the wafer is rotated. The wafer is held by the chuck sections thus moved. In the case of this type of spin chuck, however, the extent to which the chuck sections can be moved becomes smaller when the rotation of the wafer is started and stopped. This makes it impossible to stably hold the wafer.

SUMMARY OF THE INVENTION

An object of the present invention is therefore to provide a substrate scrubbing device capable of more effectively preventing dust (or particles) and process solution from adhering to the lower surface of a substrate when the upper surface of the substrate is being scrubbed.

Another object of the present invention is to provide a substrate scrubbing device capable of more stably holding the substrate even when the rotating speed of a spin chuck is accelerated for a start and decelerated for a stop.

According to an aspect of the present invention, there can be provided a substrate scrubbing device comprising means for rotating a substrate together with a spin plate; means for holding the substrate so as to form a space between the spin plate member and a lower surface of the substrate; means for applying cleaning solution onto an upper surface of the substrate; means for cleaning the upper surface of the substrate by a rotating brush; and means for blowing solution onto the lower surface of the substrate; wherein a solution passage for the solution blowing means is formed in a drive shaft of the rotating means and communicated with the space between the spin plate and the lower surface of the substrate.

Further, this substrate scrubbing device includes means for exhausting the space between the spin plate member and the lower surface of the substrate and an exhaust passage for this exhaust means is formed in the drive shaft for the rotating means.

According to the substrate scrubbing device, process solution can be exhausted outside together with other solution through the exhaust passage even when process solution comes onto the lower surface of the substrate.

According to another aspect of the present invention, there can be provided a substrate scrubbing device comprising means for rotating a substrate together with a spin plate member; means for holding the substrate in such a way that a space can be formed between the spin plate and the substrate; means for applying solution onto an upper surface of the substrate; means for scrubbing the upper surface of the substrate by a rotating brush; and an auxiliary assembly attached to the holder means to hold the substrate at the time when the rotation of the spin plate member is started and stopped.

According to this second device, the auxiliary assembly is made operative to hold the substrate when the rotating speed of the holding means is accelerated for a start and decelerated for a stop. Its structure may be therefore optional, but it is preferable that the auxiliary assembly includes a rotating member arranged rotatable in relation to the holding means and urged in forward and backward directions, and holders each being swingably pivoted on the holding means and slidably engaged, at its one end, with the rotating member and having, at its other end, pressing pieces which are to be pressed against the rim of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Some cases where the scrubbing device according to the present invention is used to resist-process semiconductor wafers will be described with reference to the accompanying drawings.

Figure 1:
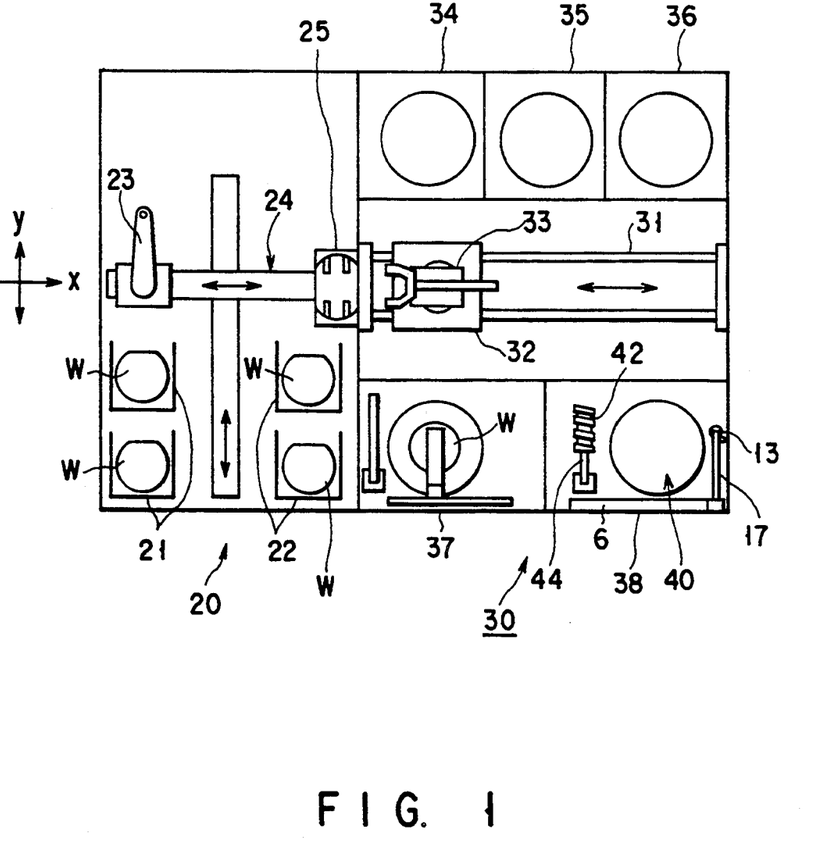
FIG. 1 is a plan showing the resist process system into which a device for scrubbing semiconductor wafers by a brush is incorporated.

As shown in FIG. 1, the resist process system has a load/unload section 20 so-called a cassette station and a process section 30. Semiconductor wafers are carried between the sections 20 and 30 by carrying robots 23 and 32. The load/unload section 20 includes a robot running passage 24. Cassettes 21 and 22 are mounted on the cassette station and wafers which are to be processed are housed in cassettes 21 and wafers which have been processed are housed in cassettes 22. The wafer carrying robot 23 has an arm for sucking and holding the wafer W, and it can move in an X axis direction along the running passage 24, in a Y axis direction, in a Z axis direction (or vertical direction) and in a direction $\theta$ (or rotating direction).

An alignment stage 25 is arranged between the load/unload section 20 and the process section 30 and the wafer W is centered and transferred from the robot 23 to the robot 32 at the alignment stage 25.

A passage 31 on which the robot 32 can run is arranged along the center line of the process section 30, extending from the alignment stage 25 in the X axis direction. The robot 32 has a main arm 33 movable in the Y and Z axes directions and also in the rotating direction $\theta$. Adhesion, pre-baking and cooling units 34, 35 and 36 are arranged on one side of the running passage 31 and resist-coating and substrate-cleaning units 37 and 38 on the other side thereof.

Figure 2:
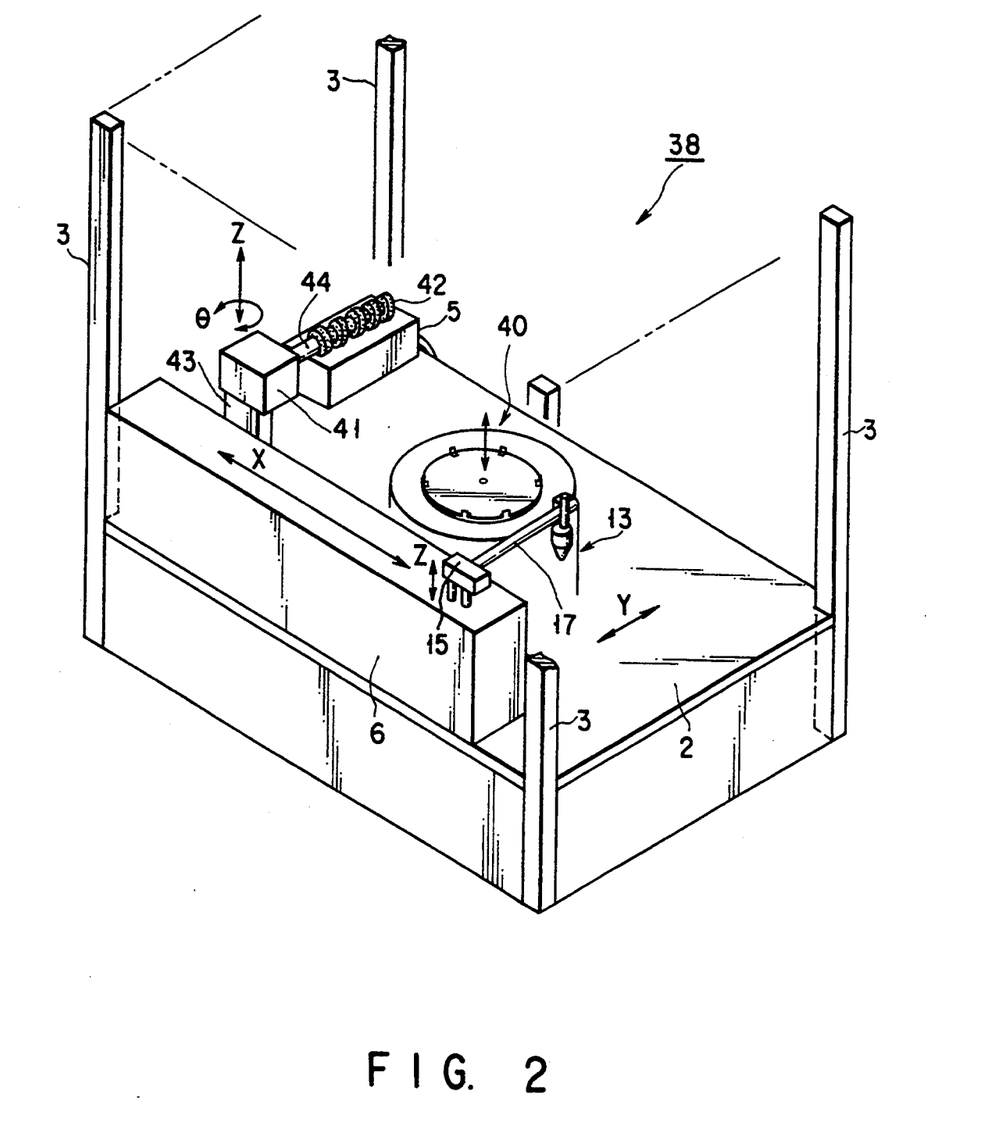
FIG. 2 is a perspective view schematically showing a unit in which the scrubbing device according to a first embodiment of the present invention is arranged.

As shown in FIG. 2, a horizontal base 2 of the substrate-cleaning unit 38 is supported by four posts 3. A brush cleaner 5, an operation mechanism 6 and a spin chuck mechanism 40 are arranged on the horizontal base 2. The operation mechanism 6 serves to move a jet nozzle 13 and a brush 42 in the X and Z axes directions. The jet nozzle 13 is attached to the front end of an arm 17, which is supported by a mechanism 15. The arm 17 can be extended in the Y axis direction and swung in the direction $\theta$ by the mechanism 15.

The brush 42 is wound round a shaft 44 in a spiral. This spiral brush 42 can make its contact area with the wafer W larger than the disk brush. In addition, it can make its contact pressure against the wafer W more uniform than the roll brush. It is made of nylon or mohair. The shaft 44 is rotated round its center axis, extended in the Y axis direction and swung in the direction $\theta$ by a drive mechanism 41, which is connected to the operation mechanism 6 by a lifter base 43 and moved in the Z axis direction by the lifter base 43. The brush cleaner 5 serves to clean the brush 42 when the brush 42 is at its waiting position.

Figure 3:
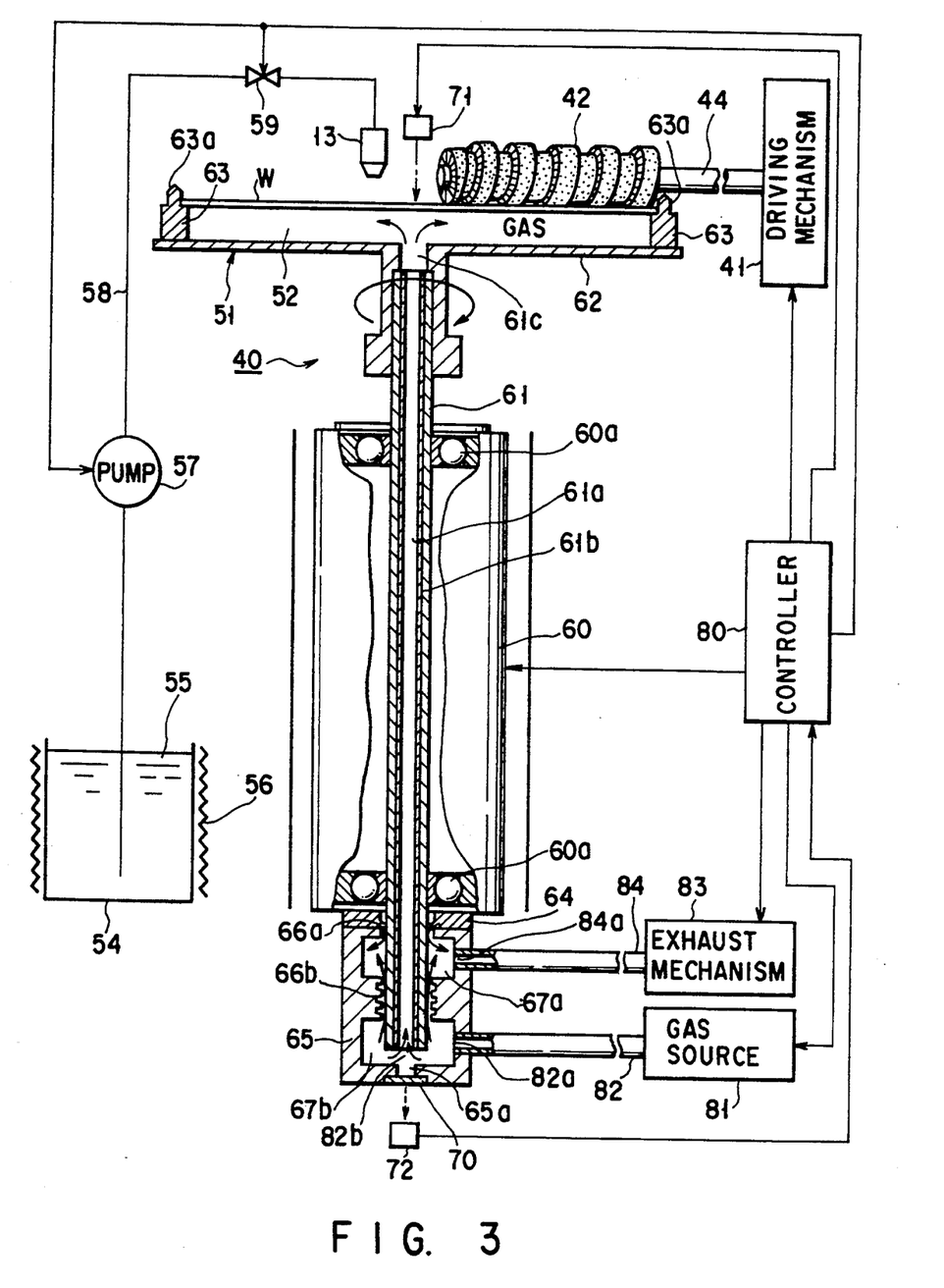
FIG. 3 is a block diagram showing a scrubber and spin chuck mechanism of the first scrubbing device partly cut out.

As shown in FIG. 3, a motor power supply (not shown) of the drive mechanism 41 is connected to the output side of a controller 80, by which the rotation number and the positioning of the brush 42 are controlled. A light-receiving sensor 72 is connected to the input side of the controller 80 and a light-emitting sensor 71, a pump 57, a valve 59, a motor 60, nitrogen gas supply source 81 and an exhaust mechanism 83 to the output side thereof. The controller 80 includes circuit-designed CPU, ROM and RAM and it sends command signals according to a predetermined recipe to control the operation of the brush, the amount of solution supplied, the rotation number of the spin chuck the flow rate of gas supplied and the amount of gas exhausted.

In FIG. 3, the brush 42 is contacted with the top surface of the wafer W on the spin chuck mechanism 40 and the jet nozzle 13 is positioned above the spin chuck mechanism 40. The jetting position of the jet nozzle 13 is shifted from that position of the brush 42 at which the brush 42 is contacted with the wafer W. The jet nozzle 13 is connected to a pure water containing tank 54 through a cleaning solution (or pure water) supply pipe 58. A pump 57 and a valve 59 are attached to the cleaning solution supply pipe 58 and the flow rate and pressure of pure water 55 are controlled by this pump and valve. A heater 56 is arranged round the tank 54 to adjust the temperature of pure water 55. When heated pure water 55 is used, particles adhering to the surface of the wafer W can be more efficiently removed from the wafer W. In addition, the wafer W which has been washed and cleaned by heated pure water 55 can be dried for a shorter time.

The spin chuck mechanism 40 will be described.

A chuck section 51 of the spin chuck mechanism 40 has a disk-like spin plate 62, which is rotated by a motor 60. The spin plate 62 is enclosed by a case (not shown). Plural holding claws 63 are erected from the top and along the rim of the spin plate 62 and a clearance (or space) 52, substantially same in depth, is formed between the wafer W supported by the holding claws 63 and the spin plate 62. It is preferable that the clearance 52 has a depth of 1–3 mm. Each of the holding claws 63 has a small-diameter portion 63a on its top and the wafer W is contacted with these small-diameter portions 63a at its rim not to be shifted in position.

A rotating shaft 61 is fixed to the spin plate 62 at its top portion and left free from (or not fixed to) a cylindrical member 64 at its lower end portion. It is supported, rotatable in the drive motor 60, by a pair of bearings 60a. A seal block 65 is connected to the underside of the cylindrical member 64 and the lower end portion of the rotating shaft 61 is enclosed by the seal block 65. First and second chambers 67a and 67b are formed in the seal block 65. The cylindrical member 64 is fixed to the underside of the motor 60 by welding.

The cylindrical member 64 and the seal block 65 are positioned relative to the rotating shaft 61 to have a clearance 66a between them. The motor 60 is communicated with the first chamber 67a through this clearance 66a. Further, an outlet 84a of the first chamber 67a is communicated with the exhaust mechanism 83 through a pipe 84 to exhaust the motor 60 and the first chamber 67a.

A labyrinth seal 66b is arranged between the first 67a and the second chamber 67b. An inlet 82a of the second chamber 67b is communicated with the gas supply source 81 through a pipe 82, through which nitrogen gas is supplied from the gas supply source 81 into the second chamber 67b. Air may be supplied instead of nitrogen gas.

The rotating shaft 61 is made hollow. One end 82b of a passage 61a in the rotating shaft 61 is communicated with the second chamber 67b and the other end 61c thereof with the space 52 (or opened at the top of the spin plate 62).

The wafer detecting sensors 71 and 72 are positioned to extend their optical axis along the passage 61a in the rotating shaft 61. A transparent plate 70 made of quartz glass is attached to the lower portion of the seal block 65 and when no wafer is mounted on the holding claws 63, beam light emitted from the sensor 71 is received by the sensor 72 through the transparent plate 70.

A case where the above-described scrubbing device is used to clean the wafer W will be described. The wafer W is carried and mounted on the holding claws 63 by a forked arm 33. The motor 60 is driven to rotate the wafer W together with the spin plate 62. The brush 42 and the jet nozzle 13 are moved above the wafer W and while spraying pure water onto the surface of the wafer through the jet nozzle 13, contaminating particles are removed from the surface of the wafer W by the brush 42. While introducing gas into the space or clearance 52 under the wafer, the first chamber 67a is exhausted. This prevents the cleaning solution or pure water from coming or adhering onto the lower surface of the wafer W. In addition, matters such as particles caused in the motor 60 are exhausted outside through the outlet 84a of the first chamber 67a. This prevents these matters from adhering onto the underside of the wafer W.

Figure 4:
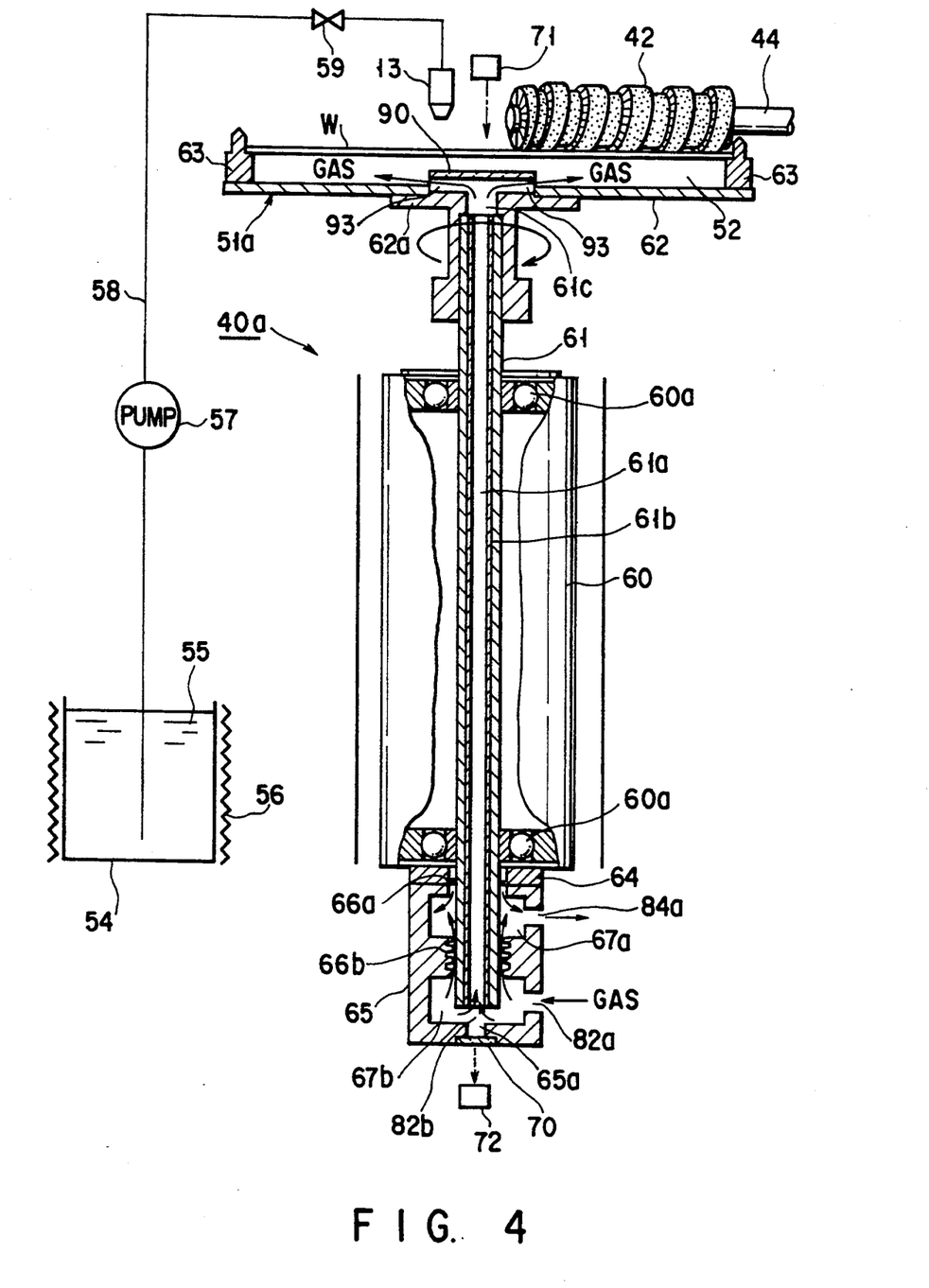
FIG. 4 is a block diagram showing a variation of the first scrubbing device in which a guide plate is added to the spin chuck mechanism, said spin chuck mechanism shown being partly cut out.
Figure 5:
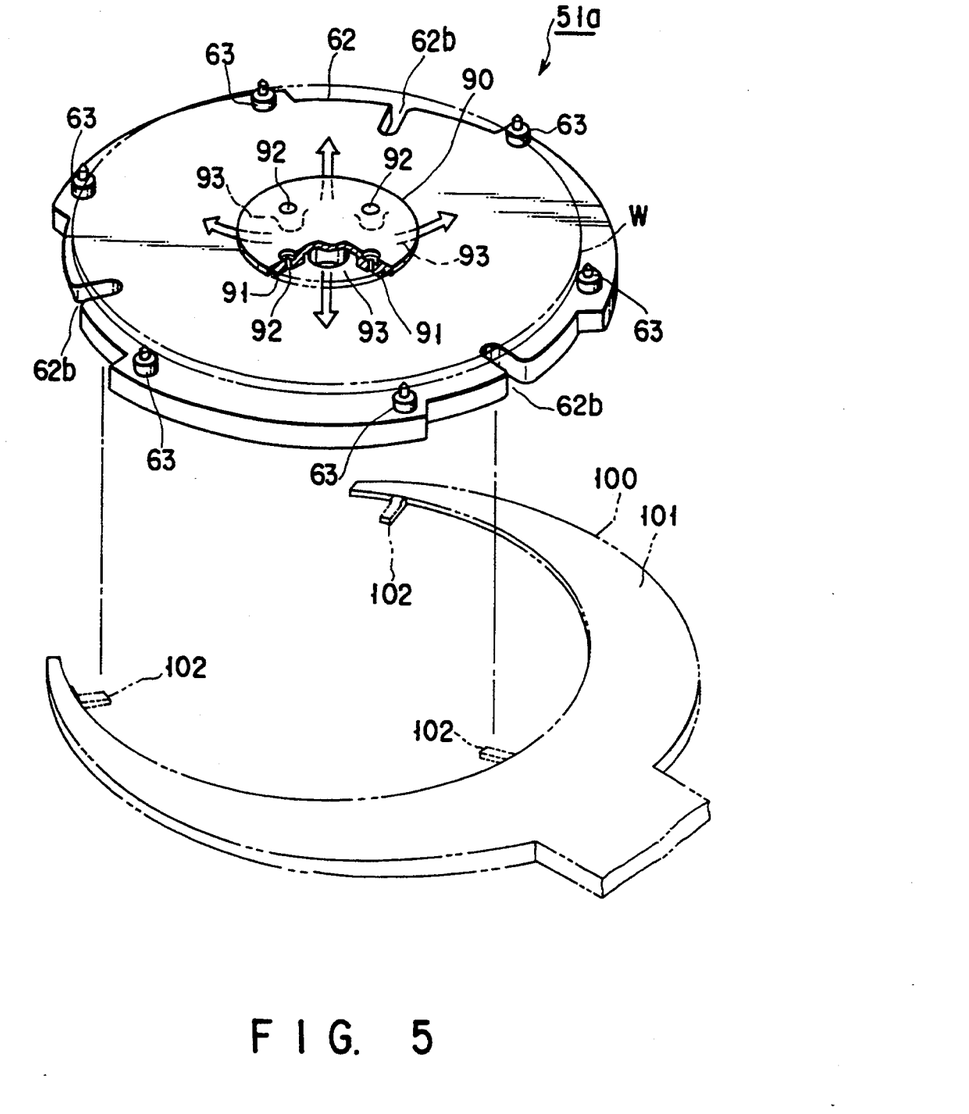
FIG. 5 is a perspective view showing a guide-plate-added chuck member and a wafer carrying arm.

As shown in FIGS. 4 and 5, a guide plate 90 may be arranged at the chuck section 51 of the spin chuck mechanism 40. It is positioned in the space 52 and just above the open top 61c of the rotating shaft 61. It guides gas introduced through the open top 61c of the rotating shaft 61 to the peripheral surface of the underside of the wafer W. It is a little separated from the top of the spin plate 62. In short, three legs 91 are attached to its underside and they are fixed to a lower boss 62a by screws 92. It is preferable in this case that the clearance 52 is in a range of 1-3 mm and that the distance extending from the top of the spin plate 62 to its underside is in a range of 1-1.5 mm.

As shown in FIG. 5, three slits 62b are formed at the peripheral portion of the spin plate 62 to allow support claws 102 of a fork 100 of arm 33 to pass through the slits 62b. When the slits 62b and the support claws 102 are combined in this manner, the form 100 which is transferring the wafer W onto the spin plate 62 can be prevented from interfering with the spin plate 62.

Figure 6:
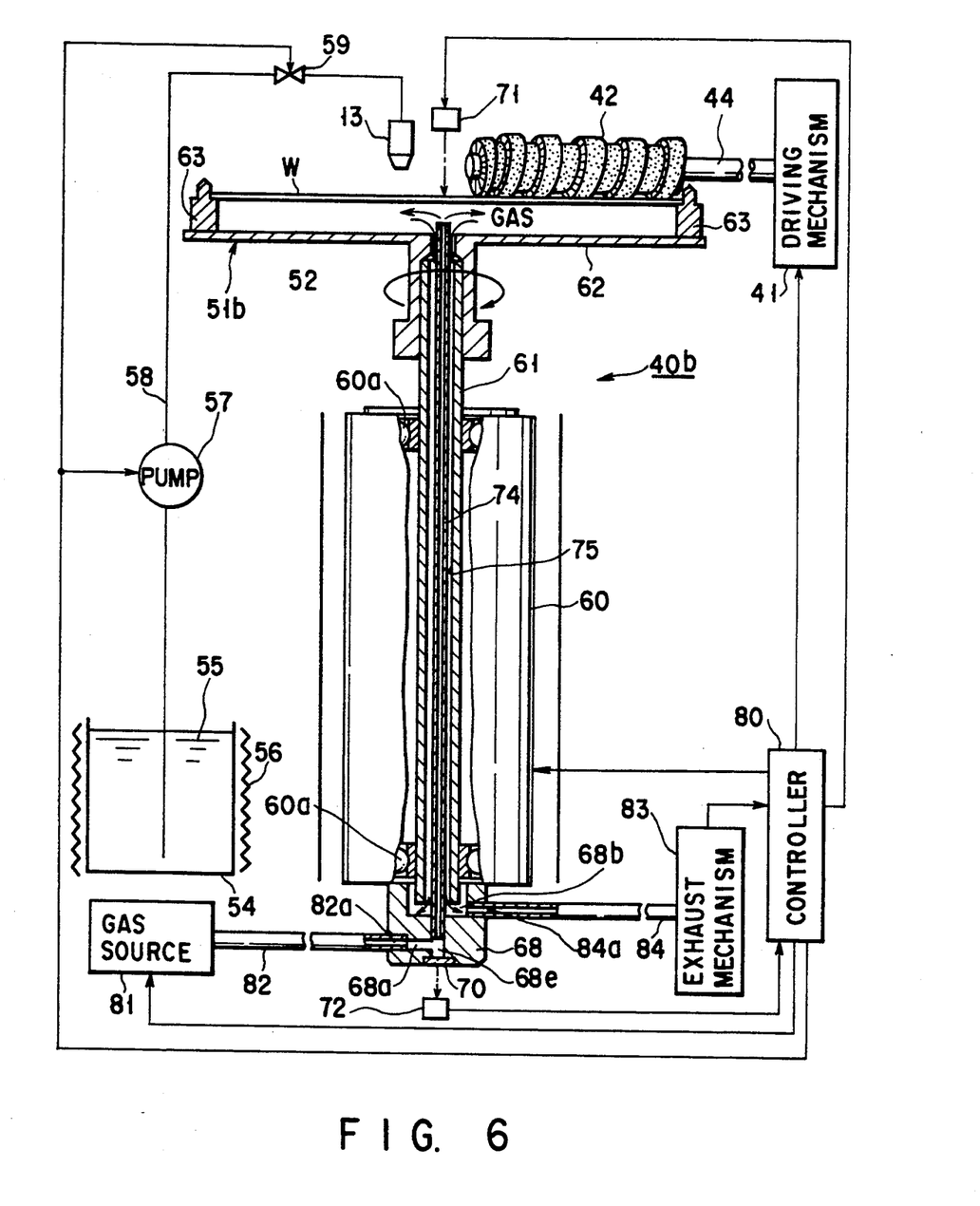
FIG. 6 is a block diagram showing a spin chuck mechanism of the device partly cut out, said device being another variation of the first scrubbing device.

Another spin chuck mechanism 40b of the double-pipe type which comprises the spin chuck rotating shaft 61 and a gas supply pipe 74 will be described referring to FIG. 6.

The rotating shaft 61 of the spin chuck mechanism 40b is made hollow and the gas supply pipe 74 is coaxially passed through the hollow portion of the shaft 61. The lower end portion of the gas supply pipe 74 is fixed to a seal block 68, which is attached to the underside of the motor 60 and provided with upper and lower chambers 68e and 68b. A passage 68a extending from the lower chamber 68e is communicated with a passage 82a of the pipe 82 and then with the gas supply source 81. The upper chamber 68b is communicated with a passage 84a of the pipe 84 and then with the exhaust mechanism 83.

The top of the gas supply pipe 74 is a little projected from the top surface of the spin plate 62 and opened in the space 52. A clearance passage 75 is formed between the hollow shaft 61 and the gas supply pipe 74. This clearance passage 75 is communicated with both of the space 52 and the upper chamber 68b.

According to the spin chuck mechanism 40b which is a combination of gas jet and exhaust, ambient atmosphere around an upper end portion of the shaft 61 is not sucked into the space 52, so that the amount of particles adhering to the lower surface of the wafer W can be reduced to a greater extent. This is because the lower area of the space 52 is exhausted through the passage 75. More specifically, ambient atmosphere around an upper end portion of the shaft 61 is sucked into the space 52 due to the so-called venturi effect. The lower area of the space 52 is exhausted through the passage 75, as described above. As a result, atmosphere is prevented from being introduced into the space 52, thereby making it difficult to contact the lower surface of the wafer.

Further, the seal block 68 which is communicated with the motor 60 is positively exhausted. This also makes it difficult for particles caused by the bearings 60a to adhere to the underside of the wafer W.

Figure 7:
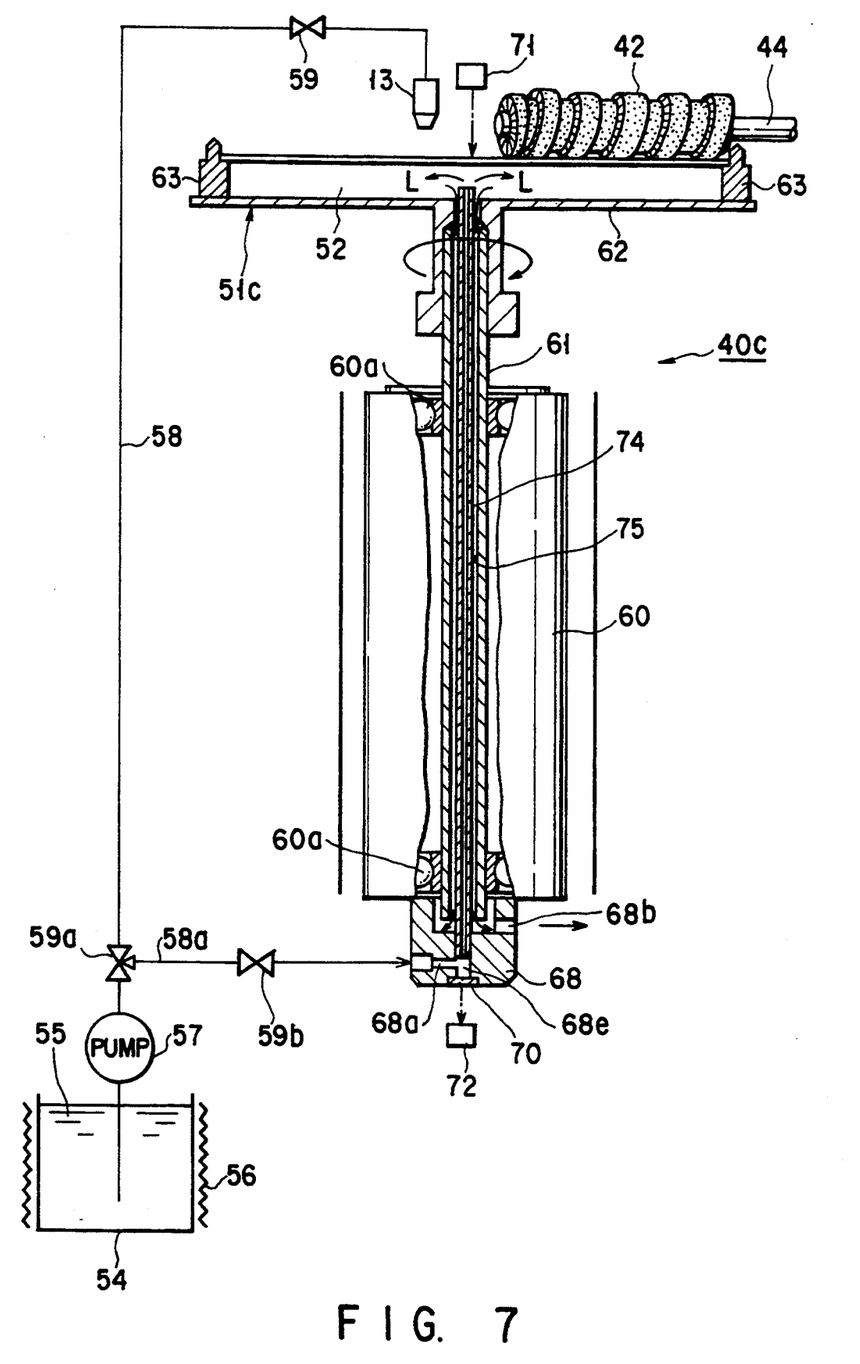
FIG. 7 is a block diagram showing a further variation of the first scrubbing device.

A further spin chuck mechanism 40c which is a variation of the mechanism 40 will be described with reference to FIG. 7.

In the case of the spin chuck mechanism 40c, solution is blown to the underside of the wafer W instead of gas. A bypass pipe 58a is communicated with the lower chamber 68e of the seal block 68 through the passage 68a. The bypass pipe 58a branches from a main pipe 58 through a cross valve 59a. The main pipe 58 is communicated with the tank 54 in which pure water as contained. The pump 57 is attached to the main pipe 58 upstream the cross valve 59a and a valve 59b is attached to the bypass pipe 58a. In short, the pure water tank 54 is used as a common source for supplying pure water to both of the jet nozzle 13 and the pipe 74.

According to the above-described scrubbing device, it can be made simpler in structure and smaller in size. In addition, the cleaning efficiency can be made higher.

According to the above-described scrubbing device, the motor can be exhausted through the seal block. Dust and particles caused by the bearings can be thus prevented from adhering to the wafer W.

Substrates which are to be scrubbed are not limited to semiconductor wafers. The scrubbing device of the present invention can also be applied to LCD substrates, photo-masks, ceramic substrates, compact disks and print substrates, for example.

A second embodiment of the present invention will be described with reference to FIGS. 8 through 12. Description on same components as those of the first embodiment will be omitted.

Figure 8:
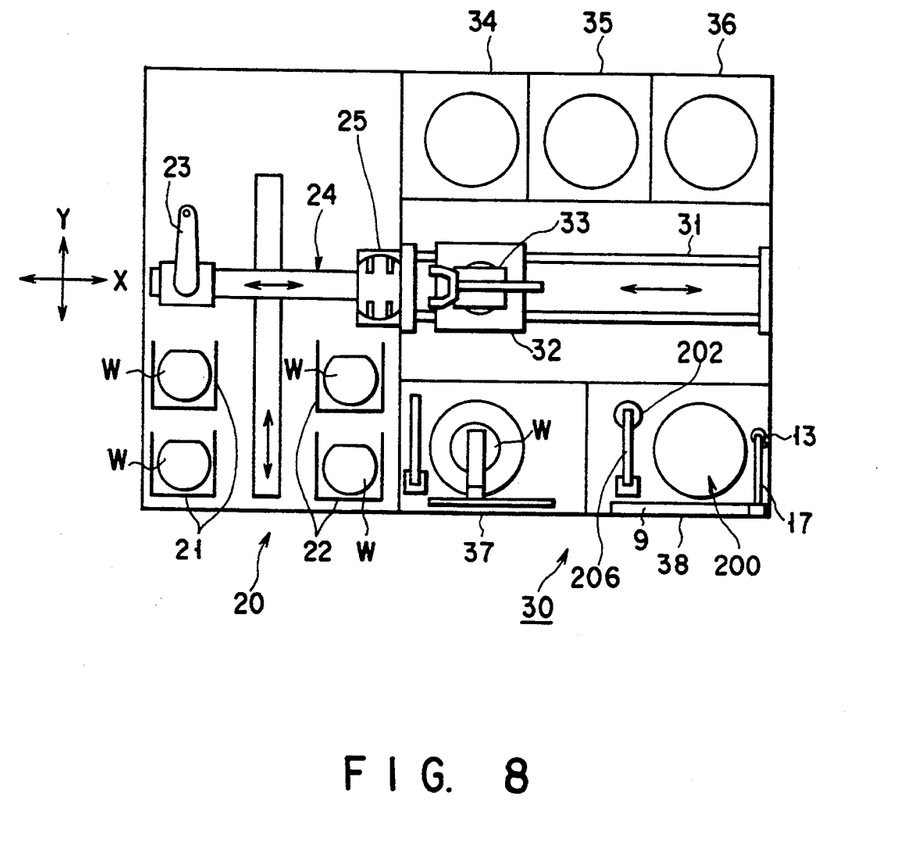
FIG. 8 is a plan showing the unit system into which another device for scrubbing semiconductors by a brush is incorporated.

As shown in FIG. 8, the resist coating and scrubbing units 37 and 38 are arranged side by side on one side of the robot running passage 31. A spin chuck mechanism 200, the Jet nozzle 13 and a disk brush 202 are arranged in the scrubbing unit 38.

Figure 9:
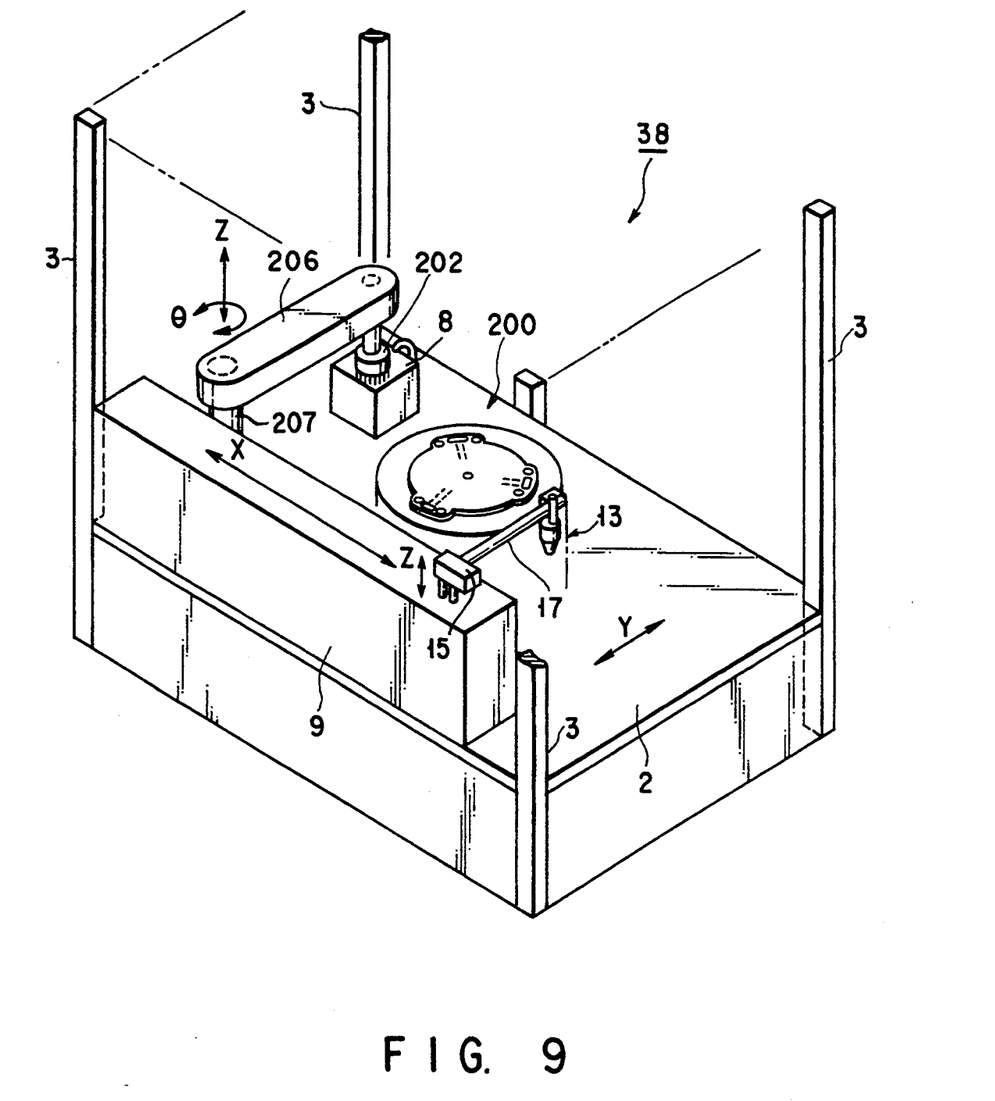
FIG. 9 is a perspective view schematically showing a unit in which the scrubbing device according to a second embodiment of the present invention is arranged.

As shown in FIG. 9, the horizontal base of the substrate scrubbing unit 38 is supported by four posts 3. A brush cleaner 8, an operation mechanism 9 and the spin chuck mechanism 200 are arranged on the horizontal base 2. The operation mechanism 9 serves to move the jet nozzle 13 and the disk brush 202 in the X and Z axes directions. The jet nozzle 13 is attached to the front end of the arm 17, which is supported by the mechanism 15. The arm 17 is extended in the Y axis direction and swung in the direction a by the mechanism 15.

The disk brush 202 is attached to the front end of an operation arm 206 in such a way that it can rotate round its own axis and swing round a support rod 207 of the arm 206. A plurality of nylon or mohair fibers are planted on the underside of the disk brush 202. When it is at its waiting position, the disk brush 202 is cleaned by the brush cleaner 8. A ultrasonic cleaning nozzle may be used in addition to the disk brush 202.

Figure 10:
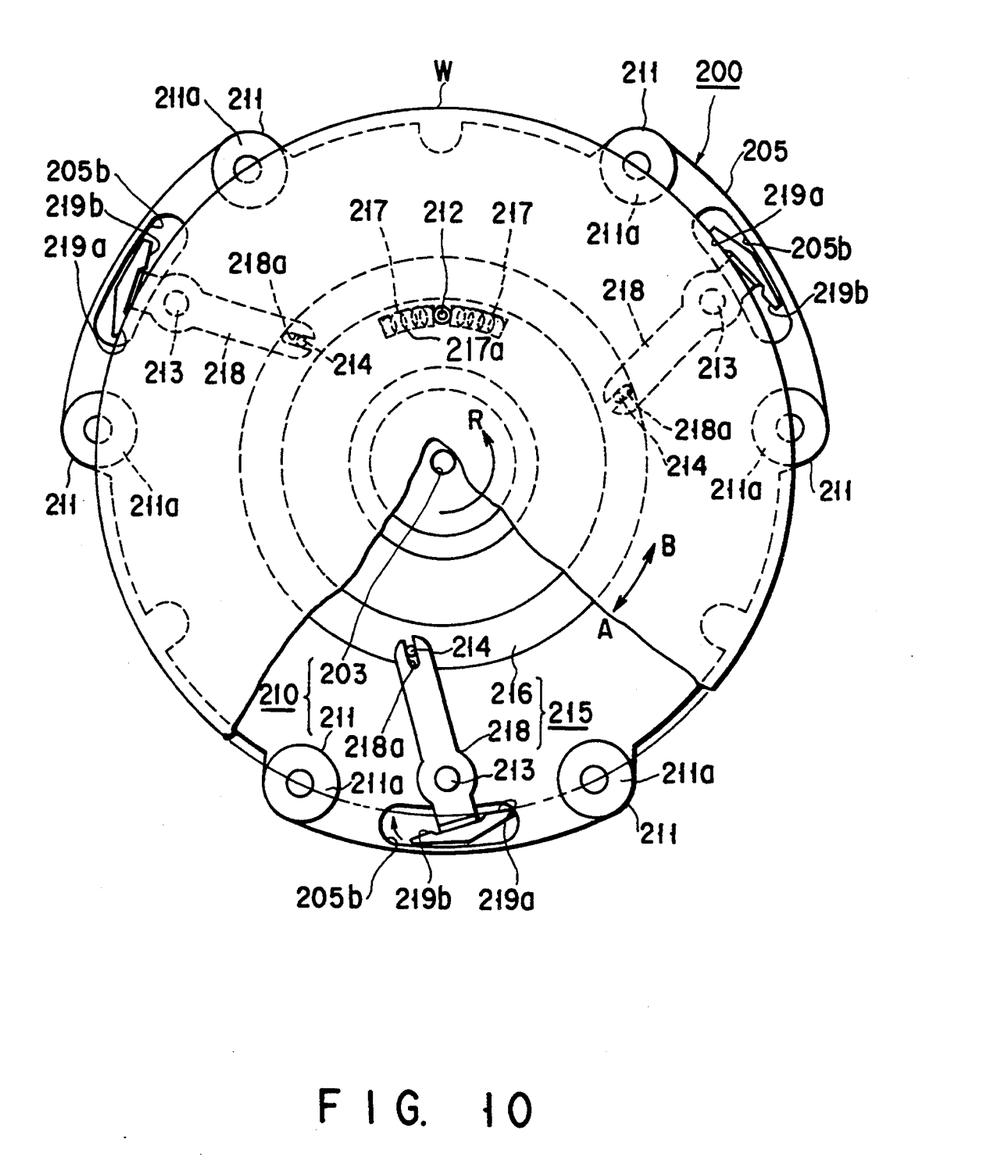
FIG. 10 is a plan showing a spin chuck mechanism of the second scrubbing device.
Figure 12:
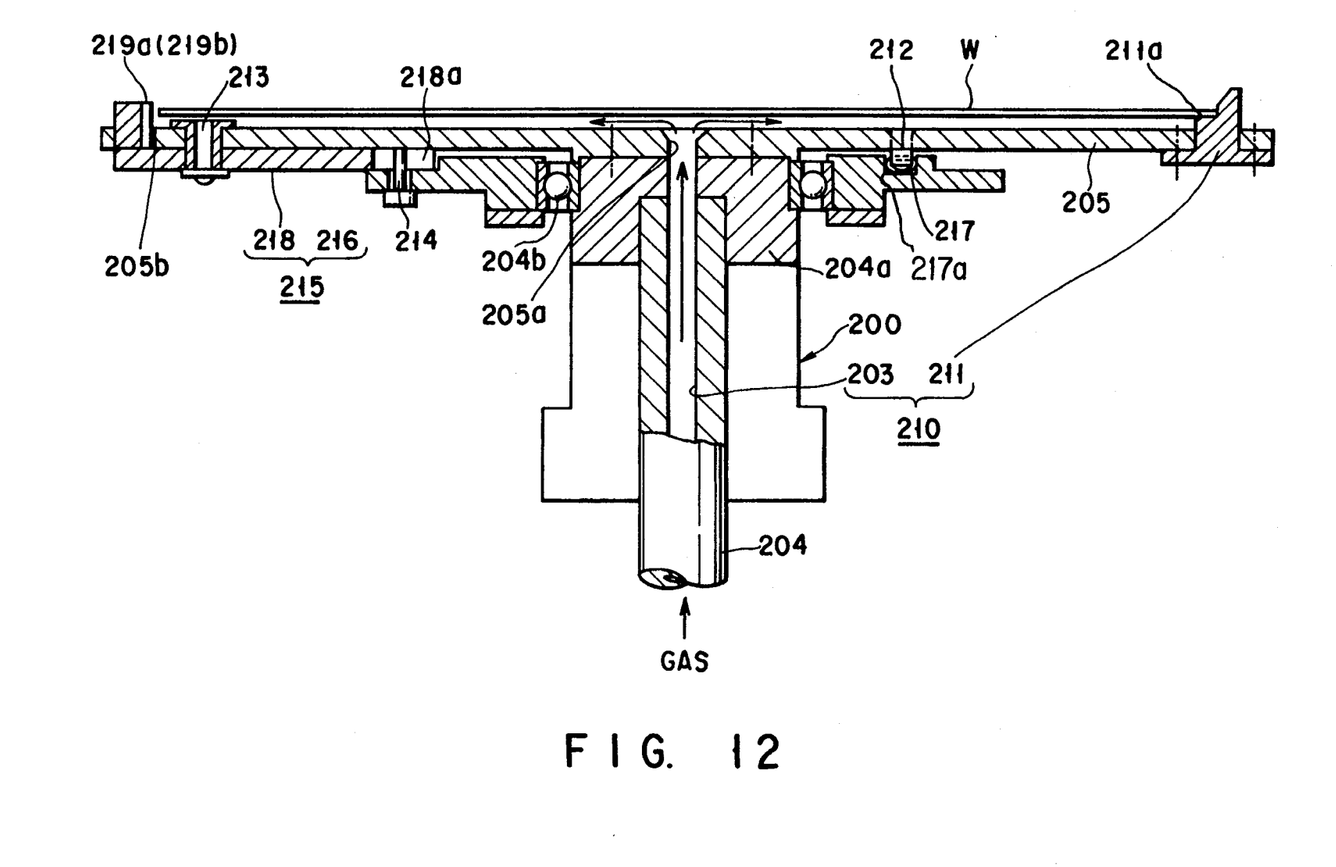
FIG. 12 is a partly-sectioned view showing the spin chuck mechanism of the second scrubbing device partly cut out.

As shown in FIGS. 10 and 12, a spin plate 205 of the spin chuck mechanism 200 is connected to the top of a hollow shaft 204 which is rotated by a drive motor (not shown). $N_2$ gas is supplied from a gas supply source (not shown) into the hollow portion of the shaft 204.

An auxiliary holder mechanism 215 is intended to hold the wafer W in such a way that the wafer W is not shifted to and fro on the spin plate 205 when the spin plate 205 is accelerated for a start and decelerated for a stop. The auxiliary holder mechanism (or assembly) 215 includes a rotator 216, springs 217 and holders 218. The rotator 216 as located under the spin plate 205 and rotatably fitted onto a rotating block 204a through a bearing 204b. The rotating block 204a is fixed to the shaft 204. The springs 217 urge the rotator 216 to neutral position. Each of the holders 218 is swingably engaged, at its one end, with the rotator 216 by a pin 214. Two pressing pieces 219a and 219b are attached to the other free end of each of the holders 218.

An arc groove 217a coaxial to the rotator 216 is formed in the top of the rotator 216 and a base or center pin 212 is inserted into the arc groove 217a. The base pin 212 is passed through the spin plate 205. Springs 217 are arranged on both sides of the base pin 212 to keep the rotator 216 neutral to rotate forward or backward.

Each of the holders 218 is a plate member pivoted on a fulcrum pin 213 to swing in a horizontal plane. The fulcrum pin 213 is attached to the spin plate 205. A slit 218a is formed at that end of the holder 218 which is nearer the rotating center of the plate 205, and the pin 214 is inserted in the slit 218a. Two pressing pieces 219a and 219b which are to be pressed against the rim of the wafer W are erected from the other end of the holder 218. They are loosely fitted into an arc guide hole 205b formed in the spin plate 205 along the rim thereof. These three holders 218 symmetrical to the center of the spin plate 205 are added to the spin plate 205.

It will be described how the above-described spin chuck mechanism 200 is operated.

When the shaft 204 is driven in a direction R, inertial force in a direction A (reverse to the direction R) acts on the rotator 216 and the holders 218 are thus swung. Free ends (or pressing pieces) 219a of the holders 218 are pressed against the rim of the wafer W, as shown in FIG. 10, to hold the wafer W not to shift to and fro in the plane of the spin plate 205. When the rotating speed of the shaft 204 becomes certain, the holders 218 are returned to neutral positions by the springs 217, so that the pressing pieces 219 of the holders 218 can be released from the rim of the wafer W.

The wafer W is rotated together with the spin plate 205. The disk brush 202 and the jet nozzle 13 are positioned above the wafer W. While jetting cleaning solution onto the surface of the wafer W through the jet nozzle 13, the disk brush 202 is contacted with the surface of the wafer W. The disk brush 202 is rotated round its own center axis and also round the support rod 207 when the wafer W is being scrubbed. Contaminating particles are thus removed from the surface of the wafer W.

This scrubbing process may be achieved using only the jet nozzle 13 wherein cleaning solution is jetted onto the wafer W through the jet nozzle 13, or using only the disk brush 202 wherein the wafer W is scrubbed by the disk brush 202 while supplying cleaning solution near the brush 202. Or both of them may be used at the same time or alternately, depending upon the kind of substrates to be scrubbed and the extent to which substrates must be scrubbed. During this scrubbing process, $N_2$ gas is supplied to the lower surface of the wafer W, flowing particularly to the peripheral portion of the wafer W. This prevents cleaning solution from coming or adhering onto the lower surface of the wafer W.

Figure 11:
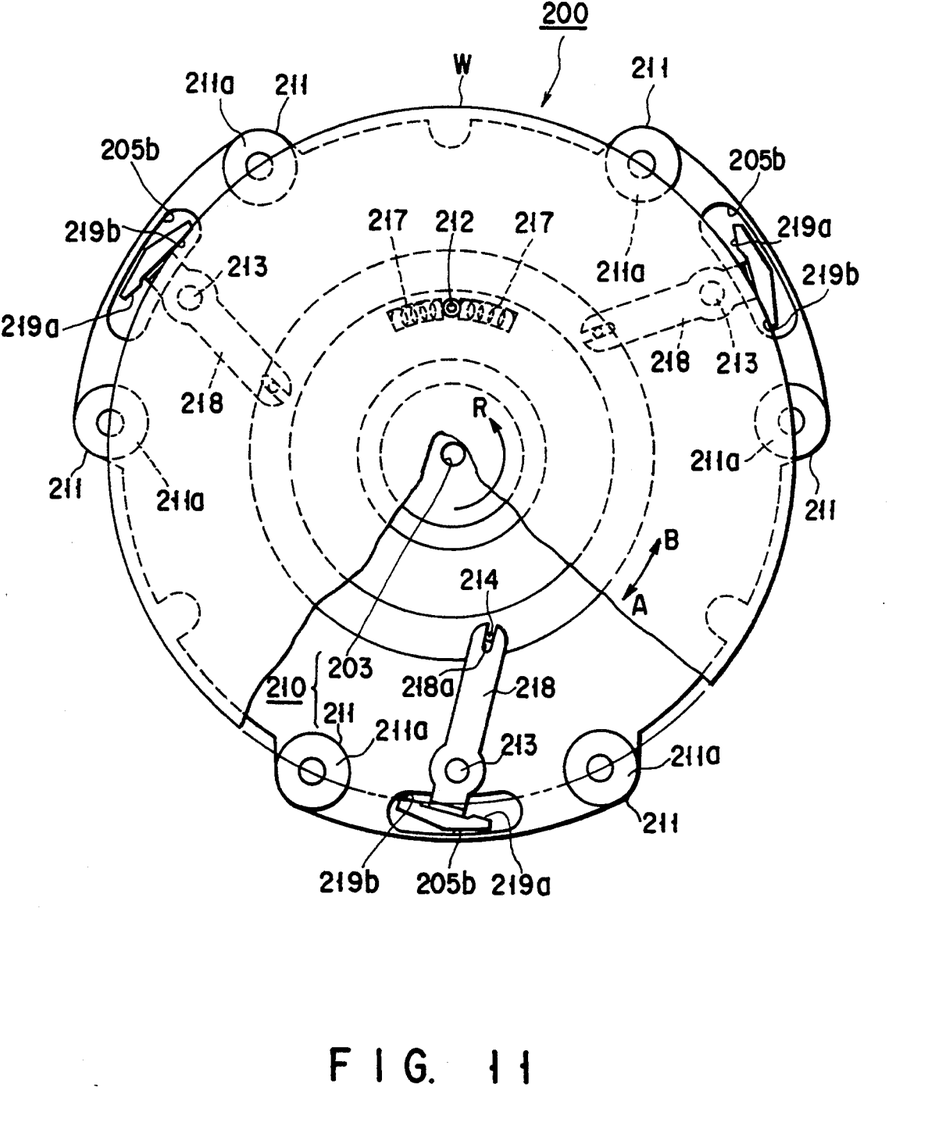
FIG. 11 is a plan showing the spin chuck mechanism of the second scrubbing device.

When the rotating speed of the shaft 204 is decelerated, inertial force in a direction B (same as the direction R) acts on the rotator 216 and the holders 218 are thus swung. Free ends (or pressing pieces) 219b of the holders 218 are pressed against the rim of the wafer W, as shown in FIG. 11, to hold the wafer W not to shift to and from in the plane of the spin plate 205. When rotations of the shaft 204 and the spin plate 205 are stopped, the holders 218 are returned to neutral positions by the springs 217 and the pressing pieces 219b are released from the rim of the wafer W.

According to the above-described spin chuck mechanism 200, the wafer W can be more reliably held in the plane of the spin plate 205 even if the spin plate 205 is abruptly accelerated or decelerated. The wafer W can be thus cleaned for a shorter time and the efficiency of processing wafers can be made higher accordingly.

Although three holders have been attached to the spin plate 205 in the above-described case, four or more holders 318 may be attached to it.

According to the above-described mechanism 200, any changes in the rotating speed of the shaft 204 at the rotation start or stop of the wafer W can be more reliably transmitted to the holders 218. This enables the wafer a to be more stably and reliably held in the plane of the spin plate 205.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A substrate scrubbing device comprising:

means for rotating a substrate together with a spin plate member;

means for holding the substrate so as to form a space between the spin plate member and a lower surface of the substrate;

means for applying a cleaning solution onto an upper surface of the substrate;

means for scrubbing the upper surface of the substrate by a rotating brush; and means for blowing a fluid onto the lower surface of the substrate;

wherein a fluid passage for the fluid blowing means is formed in a drive shaft of the rotating means and communicated with the space between the spin plate member and the lower surface of the substrate.

2. The device according to claim 1, further comprising means for exhausting the space and an exhaust passage of the exhaust means formed in the drive shaft of the rotating means.

3. The device according to claim 1, further comprising a seal block having a first chamber communicated with an open bottom end of the drive shaft and a second chamber communicated with a motor of the rotating means; and means for exhausting the second chamber in the seal block.

4. The device according to claim 3, further comprising a labyrinth seal arranged between the first and the second chamber in the seal block.

5. The device according to claim 3, wherein the first chamber in the seal block is shielded from the second chamber in the seal block.

6. The device according to claim 1, further comprising photo-sensors whose optical axis passes through the fluid passage, and means for confirming on the basis of the result detected by the photo-sensors whether or not the substrate is held on the holder means.

7. The device according to claim 1, wherein an end of a supply pipe which serves as the fluid passage for the fluid blowing means is projected from an upper surface of the spin plate member.

8. The device according to claim 1, wherein said fluid blowing means includes means for blowing gas onto the lower surface of the substrate.

9. The device according to claim 1, wherein said fluid blowing means includes means for blowing nitrogen gas onto the lower surface of the substrate.

10. The device according to claim 1, wherein said fluid blowing means includes means for blowing air onto the lower surface of the substrate.

11. The device according to claim 1, wherein said fluid blowing means includes means for blowing pure water onto the lower surface of the substrate.

12. The device according to claim 1, wherein a supply source for the fluid blowing means is common to the cleaning solution applying means.

13. The device according to claim 1, wherein said fluid blowing means includes means for blowing warmed pure water onto the bottom surface of the substrate.

14. A substrate scrubbing device comprising:
means for rotating a substrate together with a spin plate member;

means for holding the substrate so as to form a space between the spin plate member and a lower surface of the substrate;

means for applying a cleaning solution onto an upper surface of the substrate;

means for scrubbing the upper surface of the substrate by a rotating brush; and an auxiliary assembly attached to the holder means to hold the substrate at the time when the spin plate member is started and stopped.

15. The device according to claim 14, wherein the auxiliary assembly includes holders swingably pivoted on the spin plate member, spring members for biasing the holders to a neutral position, and pressing pieces erected from the free end of each of the holders and pressed against the rim of the substrate when the holder is swung.

* * * * *